United States Patent [19]
Zettler

[11] Patent Number: 5,637,904
[45] Date of Patent: Jun. 10, 1997

[54] MICROMECHANICAL COMPONENT WITH A SWITCH ELEMENT AS A MOVABLE STRUCTURE, MICROSYSTEM, AND PRODUCTION PROCESS

[75] Inventor: Thomas Zettler, München, Germany

[73] Assignee: Siemens Aktiengesellschaft, Munich, Germany

[21] Appl. No.: 431,491

[22] Filed: Apr. 28, 1995

[30] Foreign Application Priority Data

Apr. 28, 1994 [DE] Germany .......................... 44 14 970.0

[51] Int. Cl.[6] .............................................. H01L 29/82
[52] U.S. Cl. .......................................... 257/417; 257/419
[58] Field of Search ................................... 257/417, 419

[56] References Cited

U.S. PATENT DOCUMENTS 3,955,356  5/1976  LeCocq.
5,430,597  7/1995  Bagepalli et al. .................. 361/93

OTHER PUBLICATIONS

Elsevier Sequoia Publ. Sensors and Actuators A, 40 (1994) 41–47 (Hosaka et al.), "Electromagnetic . . . ".
IEEE Publ. CH2957-9/91 (Guckel et al.), pp. 74–79, "Fabrication of Assembled Micromechanical Components . . . ".
IBM Technical Discl. Bulletin, vol. 30, No. 6, Nov. 12, 1987, p. 393, "Three-Terminal Latching Micro . . . ".
IEEE Transducers 91 Publ. (Chen et al.), pp. 739–742, "A Selective CVD Tungsten Process for Micromotors".
Elsevier Science Publishers Microelectronic Eng. 13 (1991) 509–512 (Bley et al.), "Description of Micro. . . ".
Elsevier Sequoia Publication 1992 (Tavrow et al.), pp. 33–43, "Operational characteristics of microfabricated".
IOP Publ. 1991 (Mehregany et al.), pp. 73–85, "Surface micromachined mechanisms and micromotors".
IEEE Publication Jun. 22–25, 1992, pp. 126–131, "Solid-State Sensor and Actuator".

*Primary Examiner*—Stephen Meier
*Attorney, Agent, or Firm*—Herbert L. Lerner; Laurence A. Greenberg

[57] ABSTRACT

A micromechanical component includes a fixed micromechanical structure having at least two electrodes being formed of one or more conductive layers, and a movable micromechanical structure in a void or chamber forming a conductive switch element, for making an electrical contact between the electrodes with the aid of the switch element. The void or chamber can have a, for example, grid-shaped device for securing the switch element against falling out and/or a seal at the top. A microsystem with an integrated circuit and the micromechanical component, as well as a production process for the component and the microsystem, are also provided. The component and the circuit can therefore be produced simultaneously in a very simple manner.

10 Claims, 2 Drawing Sheets 5,637,904

MICROMECHANICAL COMPONENT WITH A SWITCH ELEMENT AS A MOVABLE STRUCTURE, MICROSYSTEM, AND PRODUCTION PROCESS

BACKGROUND OF THE INVENTION

Field of the Invention

The invention relates to a micromechanical component including a fixed micromechanical structure having two electrodes and a movable micromechanical structure. The invention also relates to a microsystem on a semiconductor substrate having an integrated circuit and a micromechanical component. The invention furthermore relates to a production process.

Micromechanical components are used for various purposes. Proportional and non-proportional force sensors (acceleration and inclination sensors), motors and actors are known examples. They have fixed and movable micromechanical structures, and their function is based in most cases on electrostatic forces, in particular between capacitor surfaces with variable spacing (for instance, see the article by Sherman et al. in Conf. Proc. IEDM 1992, page 501 (No. 0-7803-0817-4/92 IEEE).

In the production of such micromechanical components, there is great interest in processes that are compatible with the manufacture of integrated circuits, especially on a silicon substrate. Integrating micromechanics and trigger or evaluation circuits in microsystems is possible only if there is compatibility of the production processes. That is also important whenever existing semiconductor production systems are to be used to produce micromechanical structures as well. A process with which both an integrated circuit and a micromechanical component can be produced simultaneously in different regions of the semiconductor substrate, or in other words with which a microsystem can be produced with only minimal additional effort, besides that for the integrated circuit, would be especially advantageous.

For micromechanical components, the following production processes are known, among others:

a) Polysilicon Center Pin and Flange Process (M. Mehrengany, Y. C. Tai, J. Micromech. Microeng., Vol. 1, 73, 1991):

In order to produce the micromechanical structures following the production of the integrated circuit, such a process requires additional depositions of polysilicon after the metallizing complex. If the center pin process is to be performed before the integrated circuit is metallized, then the problem arises of etching the movable structures until they are exposed, i.e., laid bare, and simultaneously of protecting the insulation of the metallizing. Another disadvantage is the relatively high specific resistance of doped polysilicon.

b) Polysilicon-LOCOS Process (L. S. Tavrow et al, Sensors and Actuators A, Phys., Vol. A35, 33, 1992):

That process provides for making the movable micromechanical structures on a flat LOCOS oxide layer. Due to the temperature stress, the oxidation step can be performed only prior to the production of the transistors of an integrated circuit. If the entire process is carried out before the integrated circuit is produced, the resultant topology is unfavorable for the later steps, and the problem arises of protecting the micromechanical structures during the production of the integrated circuit. In an intertwined production process of that kind, the problem of etching the rotor in such a way that it is freely exposed while simultaneously protecting the circuit insulation oxides must be solved.

c) Selective Tungsten Process (L. Y. Chen et al, TRANSDUCERS '91, Int. Conf. on Solid-State Sensors and Actuators, San Francisco, Calif., IEEE Cat. No. 91CH2817-5, 739, 1991):

That process can be carried out following a circuit production process, but the proposed method does not solve the problems of electrical contacting and of protecting the metallizing insulation. The process is especially complicated and quite expensive because of the lithography steps.

d) LIGA Process (P. Bley et al, Microelectronic Engineering 13, 509, 1991; H. Guckel et al, Conf. Proceedings IEEE Micro Electro Mechanical Systems, Nara, Japan, 1991):

That process requires X-ray lithography and possibly later mounting of loose microscopic components.

None of those processes are configured in terms of their conception for the joint and in particular simultaneous production of an integrated circuit and the micromechanical component in a microsystem. They require a great number of layers and process steps, which serve solely to produce the micromechanical component, and are superfluous or even constricting or disadvantageous for the production of an integrated circuit.

SUMMARY OF THE INVENTION

It is accordingly an object of the invention to provide a micromechanical component with a switch element as a movable structure, a microsystem, and a production process, which overcome the hereinafore-mentioned disadvantages of the heretofore-known products and processes of this general type and in which only minimal additional process effort and expense are needed to make the micromechanical component, beginning with the IC production.

With the foregoing and other objects in view there is provided, in accordance with the invention, a micromechanical component, comprising a fixed micromechanical structure having at least two electrodes being formed of at least one conductive layer and being insulated from one another; and a movable micromechanical structure being disposed in a chamber and forming a conductive switch element, for making an electrical contact between the electrodes with the aid of the switch element.

With the objects of the invention in view, there is also provided a production process for a micromechanical component, which comprises forming a lower insulating layer on a substrate; forming a fixed micromechanical structure including electrodes and a movable micromechanical structure including a switch element being embedded in a middle insulating layer, from at least one conductive layer; and creating a void by removing the insulating layers around the switch element and at least part of a surface of each electrode in an etching process being selective for the switch element and for the electrodes and having an isotropic component.

With the objects of the invention in view, there is additionally provided a microsystem on a semiconductor substrate, comprising a micromechanical component including a fixed micromechanical structure having at least two electrodes being formed of at least one conductive layer and being insulated from one another, and a movable micromechanical structure being disposed in a chamber and forming a conductive switch element, for making an electrical contact between the electrodes with the aid of the switch element; and an integrated circuit having circuit elements containing or being wired to the at least one conductive layer.

With the objects of the invention in view, there is concomitantly provided a production process for a microsystem, which comprises producing a micromechanical component by forming a lower insulating layer on a substrate; forming a fixed micromechanical structure including electrodes and a movable micromechanical structure including a switch element being embedded in a middle insulating layer, from at least one conductive layer; and creating a void by removing the insulating layers around the switch element and at least part of a surface of each electrode in an etching process being selective for the switch element and for the electrodes and having an isotropic component; and producing a part of a circuit element or a wiring from the at least one conductive layer, simultaneously with the micromechanical structures, in a region of an integrated circuit having circuit elements containing or being wired to the at least one conductive layer.

The invention concerns the use of the movable structure as a switch element between two mutually insulated fixed electrodes. Such a switch is known macroscopically as a so-called mercury switch. Depending on its position, the movable conductive switch elements do or do not produce an electrical connection between the electrodes.

The component preferably includes a securing device which secures the switch element against falling out;, which securing device is formed from a higher-lying layer. This layer may be conductive or nonconductive and it may be structured in grid-like fashion above the movable structure. Since the securing device is produced, among other ways, exposing the switch element by etching, it must be structured in such a way that it permits the exposure by etching with an etching process having an isotropic component. After the exposure by etching, the component can be hermetically sealed with the aid of a cover layer, which to the extent possible is deposited non-conformally, so that it is protected against external influences and is mechanically very stable.

The component can be used as a non-proportional force sensor (event sensor) by utilizing the force of inertia on the movable switch element and detecting a short circuit (or an interruption) between the (externally connectable) electrodes. However, it is equally possible to detect other exertions of force on the movable structure, such as by a flowing liquid or gas or the direct exertion of force by an external mechanical component.

In the production process of the invention, the switch element and the electrodes are structured from the same or different conductive layers. The fixed and the movable structures are initially separated from one another by at least one insulating layer, and at least the movable structure is also separated from the substrate. A mask is then applied and an etching process is carried out with an isotropic component, which removes the insulating layer selectively down to the conductive layer or layers. After the etching process, the switch element is either freely movable and no longer has any connection with the remainder of the component, or is still connected therewith through separable fuses. The electrodes are exposed on at least one of their surfaces (the one toward the switch element), so that the switch element, when it moves, can establish a contact between the electrodes through these surfaces.

The invention also encompasses a microsystem with an integrated circuit (IC) and a micromechanical component. In the microsystem, one or more conductive layers, which are already needed for the integrated circuit, for instance for its wiring, are used as parts of the micromechanical component. This layer or these layers need merely be structured with a suitable layout so that in the region of the micromechanical component, at least two electrodes are formed as fixed micromechanical structures, and a switch element is formed as a movable micromechanical structure. The process which is already used in IC production for exposing the connection pads by etching can be used as the etching process with an isotropic component. The mask which is employed need merely be suitably constructed in the region of the component so that the switch element and one surface of the electrodes are exposed, i.e., laid bare. The integrated circuit may have a single-layer or multilayer wiring (that is, one or more metallizing layers), of which one, several or all can be used for the micromechanical component. The integrated circuit can also be made with any arbitrary technology, such as CMOS. Preferably, it includes an evaluation circuit, with which the electrodes are connected directly. Details of such a circuit are shown in FIGS. 1 and 2 of co-pending Application Serial No. (Attorney's Docket No. GR 94 P 1271), entitled "Microsystem with Integrated Circuit and Micromechanical Component, and Production Process", which is expressly incorporated by reference herein.

Other features which are considered as characteristic for the invention are set forth in the appended claims.

Although the invention is illustrated and described herein as embodied in a micromechanical component with a switch element as a movable structure, a microsystem, and a production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
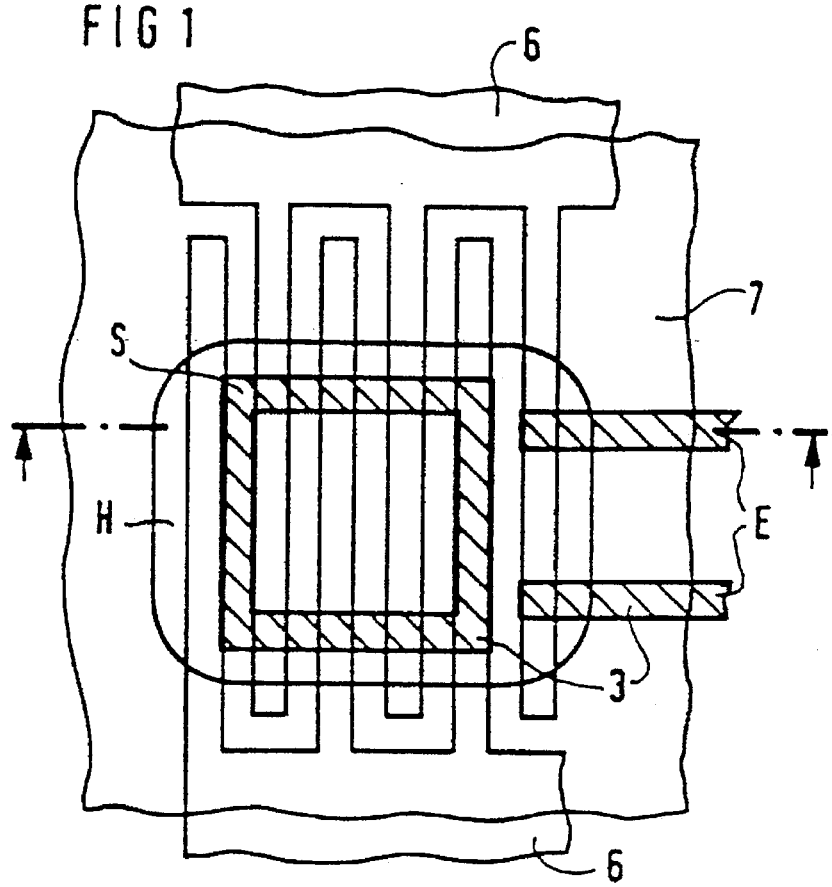
FIG. 1 is a fragmentary, diagrammatic, plan view.
Figure 2:
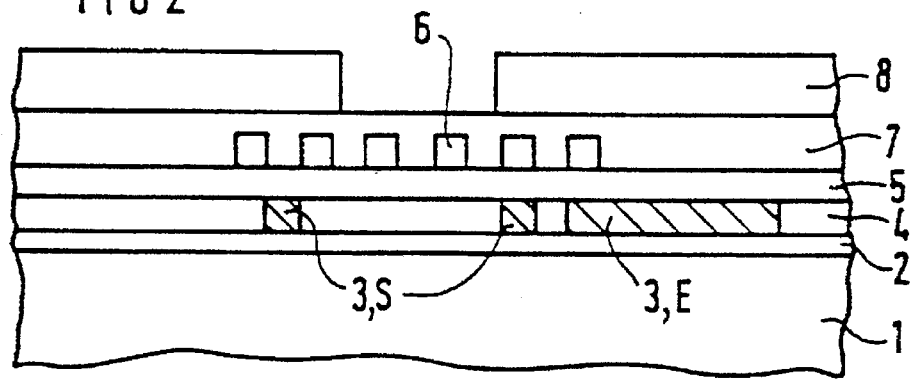
FIGS. 2 and 3 are fragmentary, cross-sectional views, of a semiconductor substrate in a region of a micromechanical component, in terms of which the process is illustrated.
Figure 3:
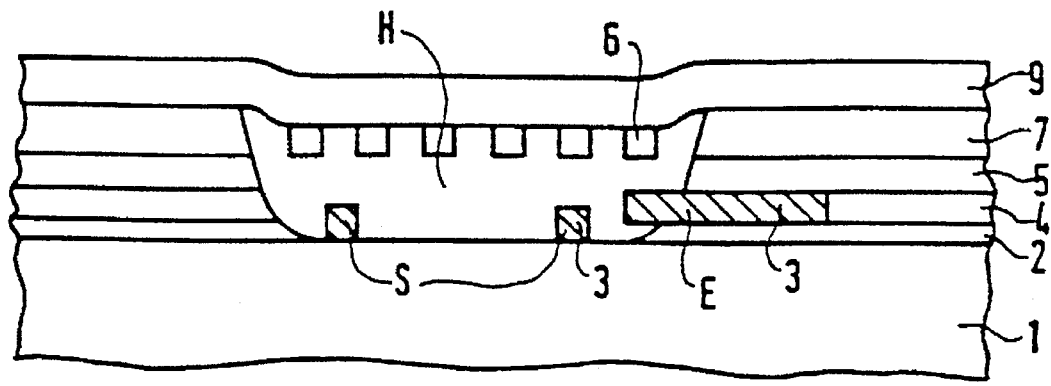

Referring now to the figures of the drawing in detail and first, particularly, to FIGS. 1–3 thereof, there is seen an embodiment in which a micromechanical component has two electrodes E and a movable switch element S in the form of a hoop, which are structured from the same conductive layer 3.

The switch element S and one end of each electrode are located in a void or chamber H, and the structures and the void or chamber are dimensioned in such a way that when the switch element S moves, an electrical contact between the electrodes can be made or broken. The electrodes can be connected from the outside. In the exemplary embodiment, the electrodes are disposed on the same wall of the void or chamber. Preferably, a device for securing the switch element S against falling out is provided, which may include a grid-like structured layer above the void. Side walls of the void or chamber H are formed by contact surfaces of the electrodes E and by a lower insulating layer 2, a middle insulating layer (in this case a double layer) 4, 5, and an upper insulating layer 7. The bottom of the void or chamber is formed by a substrate 1. At the top, the void or chamber can additionally be hermetically sealed by a cover layer 9 (the cover layer 9 is not shown in FIG. 1).

In FIG. 2, a substrate with an arbitrary surface (such as silicon, a field oxide, or a suitable etch stop layer) is shown. A lower insulating layer 2 is applied over the substrate and is optionally structured. A conductive layer 3, for instance a first metallizing layer, is applied over the lower insulating layer 2 and structured to make the electrodes E and the switch element S. The dimensions discussed above should be observed for these elements and for the thickness of the lower insulating layer 2 (or of the earlier etching depth). One or more middle insulating layers 4, 5 are applied and optionally planarized. In order to prevent the movable switch element, which is to be exposed later, from falling out, a layer 6 is applied and is structured above the later void or chamber in some suitable way, for instance in grid-like fashion. The securing device is covered with an upper insulating layer 7.

Next, an etching process is carried out by applying a mask 8 which has an opening above the switch element 6 to be exposed, or the layer 6 is used as the mask (which then must be suitably structured, especially at the edge and outside the void). The insulating layers 2, 4, 5, 7 are etched. In this operation, the following conditions must be taken into account:

the etching process must be sufficiently selective for the conductive layer 3, and in this example for the contact 6 as well; and the isotropic component of the etching process and the size of the opening in the mask must be chosen, while taking the individual layer thicknesses into account, in such a way that the switch element S will be entirely underetched. The side of the electrodes toward the switch element must also be exposed by etching.

The etching process is preferably carried out in the form of wet etching, with a buffered HF solution, or in the form of microwave-supported dry etching.

After the exposure by etching, the component can be closed by a largely non-conformal deposition of a cover layer. One such process is described in German Published, Non-Prosecuted Application DE 43 32 843 A1, entitled "Mikromechanische Vorrichtung und Verfahren zu deren Herstellung" [Micromechanical Device and Process for Producing It]. For example, plasma nitride, PSG or BPSG can be deposited, in a process with poor corner coverage. The underlying gate or grid 6 is advantageous for the process, but is not absolutely necessary.

The processes and materials known from IC production (for instance, silicon oxide as the insulating layer and aluminum alloys or tungsten-containing layers as the conductive layer) can be employed for the individual steps of the production process.

The gate 6 can be formed of an insulating layer or a conductive layer. In the latter case, gate electrodes can also be formed, in addition to the lateral electrodes.

Figure 4:
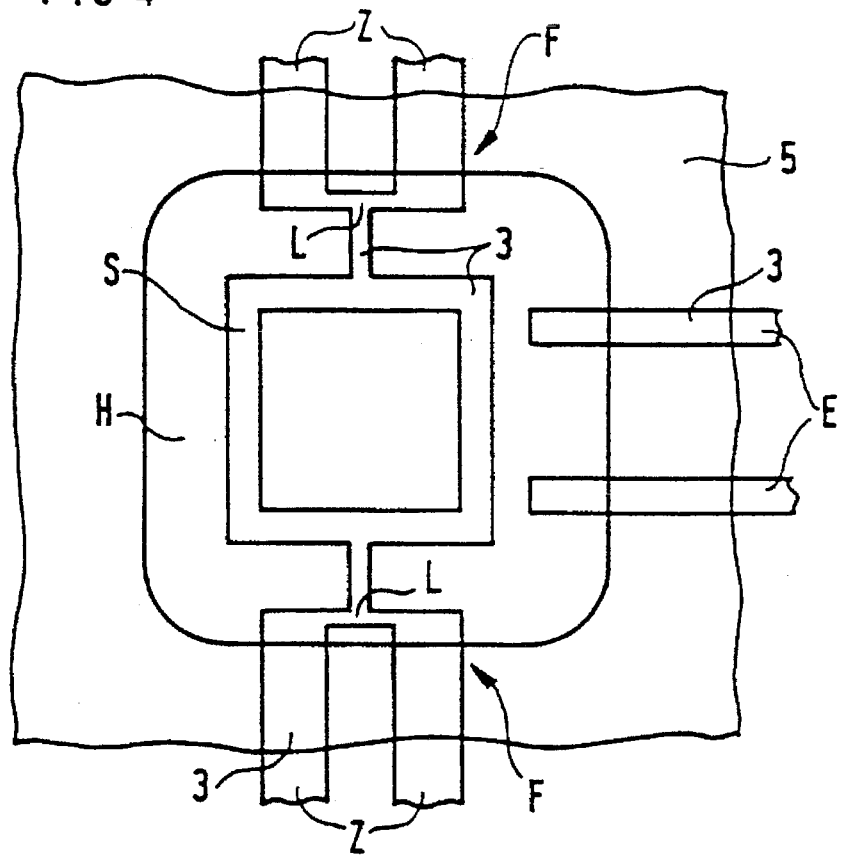
FIG. 4 is a fragmentary, plan view of the micromechanical component according to a further embodiment of the invention.

With regard to FIG. 4, it is noted that micromechanical components have what is known as a sticking problem, that is the adhesion of the movable structure to the substrate beneath them after they have been exposed by etching, as the result of capillary forces in drying (in the case of wet etching). In order to solve this problem, one or more fuses may be provided in the component, as is described in the article by W. Yun et al. in IEEEE Conference 1992, 0-7803-0456-X/92, page 126.

FIG. 4 shows a plan view of a component that is improved in this way, with two fuses F (without a gate or cover layer). A fuse is formed of wide supply wires Z and a narrow melting wire L, both being made of a conductive material. Preferably, the conductive layer is used. The fuses firmly hold the switch element S even after the underetching and thus prevent it from sticking to the substrate 1. Once the production process, as described above or below in paragraphs A–D, has been concluded, a voltage is applied to the supply wires Z to feed a current pulse of suitable magnitude and duration through the melting wires L, causing the melting or destruction of the fuse at this point. This makes the switch element freely movable for the first time. Since after the wires L have melted the supply wires Z are no longer electrically connected to the switch element, they can then be employed as electrodes. The melting wires can also be provided on the electrodes themselves, so that the electrodes perform the task of the supply wires, and additional fuses can be dispensed with. Therefore it is possible to provide fuses without taking up any additional space.

In the construction of the fuse and in controlling the current pulse, care must be taken to assure that the current pulse will melt the melting wire L in such a way that the switch element is disconnected from both supply wires and thus becomes freely movable. If the supply wires are to be used as electrodes later, then they also need to be reliably disconnected from one another.

The component can be integrated into a microsystem, and the production of the IC (for instance, a trigger or evaluation circuit) takes place simultaneously with the described process. The following points are advantageously taken into account:

On the substrate 1, further method steps that are necessary to make the integrated circuit are performed, such as the production of epitaxial layers, doped wells, channel implantation, and gate oxide. The layer 2 can be used, for instance, for the gate insulation of the IC. An implantation of the source/drain zones is carried out, among other operations.

In the IC region, the conductive layer 3 may act as the first metallizing layer, for instance to connect S/D zones of transistors. The micromechanical structures E, S can also be formed from the gate layer, so that the layer 3 is formed of polysilicon.

Planar layers are preferably used, in situ or by suitable processes, as insulating layers. Planar layers are also advantageous in the region of the micromechanical component (region BT).

The upper insulating layer 7 can be formed of the usual passivation, made of silicon oxide and silicon nitride. The mask 8, which in the region BT has an opening above the movable structure to be exposed, has openings in an IC region IS above the pads that are to be connected from outside. In the IC region, the isotropic etching must stop at these connection pads.

If the micromechanical component is provided with a seal, separate photoresist masks and etching processes are used for the void or chamber and for etching the pads to expose them, namely before and after the deposition of the cover layer, respectively.

For the securing device, in the case of multilayer wiring, for instance, a higher-lying metallizing layer or a silicon nitride layer conventionally used as part of the passivation can be employed.

The microsystem is made up largely or even entirely of layers that are already needed for the integrated circuit, which makes production very simple. In the simplest case, only one structural provision (mask adaptation) is required.

The essential points of several examples of microsystems according to the invention will be described below:

Example A:
S+E: Metal No. 1 (reference numeral 3)
Grid: Metal No. 2 (reference numeral 6)

The layer 2 is formed by an intermediate oxide on a field oxide 1 and is provided with the necessary contact holes in the IC region IS. The metal No. 1 layer 3 is of AlSiCu, optionally with top and bottom layers of Ti+TiN, and is structured in the region BT to make electrodes and the switch element. The middle insulating layers 4, 5 are formed by a planar intermetallic dielectric, in which vias are made. Lines and pads as well as the grid are made in suitable form from the metal No. 2 layer 6. Plasma oxide and plasma nitride (passivation) are deposited as the upper insulating layer 7. With a jointly used photoresist mask 9, the pad opening and the void or chamber are defined, and an isotropic etching that is selective for AlSiCu is carried out, for instance with $CF_4$ plasma or $NF_3$ plasma and optionally densification by microwave excitation. Finally, the mask 9 is removed. This process requires no additional steps and a structural adaptation need merely be performed.

Example B:
S+E: Metal No. 1 (reference numeral 3)
Grid: Metal No. 2 (reference numeral 6)
Hermetic sealing of the void or chamber The process proceeds as in Example A, up to and including the deposition of the passivation layer. Next, a photoresist mask is applied only for the void, the void is etched, and the photoresist mask is removed. Then plasma nitride, plasma oxide, BPSG and/or PSG is deposited as a seal, and a photoresist mask for the pad openings is applied. In a $CHF_3/O_2$ plasma, the pads are exposed, and then the photoresist mask is removed.

Example C:
S+E: Polysilicon (reference numeral 3)
Grid: $Si_3N_4$ (reference numeral 6)
2-Layer metallization As a modification of the examples described thus far, the switch element and the electrodes are structured from the gate polysilicon. The middle insulating layer 4 acts essentially as the intermediate oxide, and the middle insulating layer 5 is a multiple layer being formed of some of the intermediate oxide as well as the intermetallic dielectric and the plasma oxide of the passivation. The layer 6 is formed of the plasma nitride of the passivation and is structured to make both a grid and an etching mask for the pad openings, for instance in a $CHF_3/O_2$ plasma. The mask is removed, and an isotropic oxide etching with buffered HF is carried out.

This process requires no additional steps. Since the isotropic HF etching can attack the metal AlSiCu under some circumstances, separate photographic techniques can be chosen for the void or chamber and for the pad openings.

Example D:
S+E: Polysilicon (reference numeral 3)
Grid: $Si_3N_4$ (reference numeral 6)
Hermetic sealing of the void or chamber
2-Layer metallization The process proceeds as in Example C, up to and including the passivation deposition. Then a photoresist mask is first applied to define the grid and the void, and an anisotropic $Si_3N_4$ etching is carried out, for instance with a $CHF_3/O_2$ plasma. The mask is removed, and by using the $Si_3N_4$ layer as a mask, an isotropic oxide etching is performed, to create the void. With the aid of a non-conformal deposition, for instance of plasma nitride, the void is sealed, and a mask for exposing the pads by etching is applied, and then the plasma nitride and plasma oxide etching is performed.

In the examples described, problems can arise from sticking of the switch element to the substrate 1. These problems can be overcome either by the fuses described above, or by proceeding from the HF etching to the photoresist application without an intervening drying step, and/or by removing the photoresist dry in an $O_2$ plasma.

I claim:

1. A microsystem on a semiconductor substrate, comprising:

a micromechanical component including a fixed micromechanical structure having at least two electrodes being insulated from one another, and a movable micromechanical structure disposed in a chamber and forming a conductive switch element, for making an electrical contact between said electrodes with the aid of said switch element;

an integrated circuit having circuit elements containing or being wired to said at least one conductive layer; and a conductive layer forming at least one of said circuit elements and at least one component selected from the group consisting of said electrodes and said movable micromechanical structure.

2. The microsystem according to claim 1, including a device for securing said switch element against falling out, said integrated circuit having a plurality of conductive layers in the form of a multilayer metallization, and said electrodes, said switch element and said securing device being formed of a plurality of said metallization layers.

3. The microsystem according to claim 1, including a layer used for passivation of said integrated circuit, said securing device being formed with the aid of said layer used for passivation.

4. The microsystem according to claim 1, wherein said at least one conductive layer is formed of a material selected from the group consisting of an aluminum alloy and a material being substantially formed of tungsten.

5. The microsystem according to claim 1, including a further insulating or conductive layer forming a device for securing said switch element against falling out.

6. The microsystem according to claim 5, wherein said electrodes, said switch element and said securing device are formed of layers containing metal.

7. The microsystem according to claim 5, wherein said electrodes and said switch element are formed of polysilicon, and said securing device is formed of silicon nitride.

8. The microsystem according to claim 1, wherein said electrodes and said switch element are formed from the same conductive layer.

9. The microsystem according to claim 1, including a cover layer sealing said chamber at the top.

10. The microsystem according to claim 1, including fuses being connected to said switch element, for disconnecting said switch element by applying a voltage to said fuses.

* * * * *